United States Patent [19]

Matsuura et al.

[11] Patent Number: 5,314,870
[45] Date of Patent: May 24, 1994

[54] PREPARING THIN FILM OF OXIDE SUPERCONDUCTOR

[75] Inventors: Takashi Matsuura; Kenjiro Higaki; Hideo Itozaki, all of Hyogo, Japan

[73] Assignee: Sumitomo Electric Industries, Ltd., Osaka, Japan

[21] Appl. No.: 963,261

[22] Filed: Oct. 19, 1992

Related U.S. Application Data

[63] Continuation of Ser. No. 720,161, Jun. 27, 1991, abandoned.

[30] Foreign Application Priority Data

Jun. 28, 1990 [JP] Japan ................... 2-170993

[51] Int. Cl.$^5$ .................... B05D 5/12; C23C 14/34
[52] U.S. Cl. .................... 505/476; 505/730; 505/731; 505/701; 505/702; 204/192.24; 427/62; 427/126.3; 427/419.3; 427/314
[58] Field of Search .................... 505/1, 730, 731, 732, 505/701, 702; 427/62, 63, 126.3, 419.3, 314; 204/192.24

[56] References Cited

U.S. PATENT DOCUMENTS 4,880,770 11/1989 Mir et al. .................... 505/1

FOREIGN PATENT DOCUMENTS

0341148A2 11/1989 European Pat. Off. .
64-38917 2/1989 Japan .................... 505/702

OTHER PUBLICATIONS

Lin et al, "In situ growth of superconducting Y-Ba-Cu-O Films on Si, SiO$_2$, GaAs and Cu/Ag by the high-pressure DC sputtering process", Jpn. J. Appl. Phys. 28(12) Dec. 1989 pp. L2200-L2203.
Harada et al, "Y-Ba-Cu-O Thin Film on Si Substrate", Jpn. J. Appl. Phys. 27(8) Aug. 1988 L1524-1526.
Witanachchi et al. "As-deposited Y-Ba-Cu-O superconducting films on silicon at 400° C.," Appl. Phys. Lett. 54(6) Feb. 1989 pp. 578-580.

Primary Examiner—Roy V. King
Attorney, Agent, or Firm—Kerkam, Stowell, Kondracki & Clarke

[57] ABSTRACT

A process for preparing a thin film of oxide superconductor on a single crystal substrate of semiconductor by RF sputtering. At first, an under-layer of an oxide having a thickness of 50 to 200 Å is deposited on the single crystal substrate of semiconductor at a substrate temperature of lower than 500° C., and secondly an upper-layer of superconducting oxide material is deposited on said under-layer at a substrate temperature of higher than 600° C.

8 Claims, No Drawings

PREPARING THIN FILM OF OXIDE SUPERCONDUCTOR

This application is a continuation of application Ser. No. 07/720,161, filed Jun. 27, 1991 now abandoned.

BACKGROUND OF THE INVENTION

1. Field of the Invention

The present invention relates to a process for preparing a thin film of oxide superconductor on a single crystal substrate of semiconductor by physical vapour deposition.

2. Description of the related art

Superconducting oxide materials such as Y—Ba—Cu—O system, Bi—Sr—Ca—Cu—O system, Tl—Ba—Ca—Cu—O system or the like are expected to be utilized in electronics devices such as Josephson element or superconducting transistors due to their high critical temperatures (Tc). In order to realize such electronics devices, it is indispensable to prepare thin films of these oxide superconductors.

Recently, it has become possible to prepare single crystal thin films of these oxide superconductors of good quality on a single crystal substrate of MgO, $SrTiO_3$ or the like by physical vapour deposition technique including sputtering, vacuum evaporation and laser abrasion or by chemical vapour deposition technique.

However, in the case of the superconducting transistors in which a single crystal thin film of oxide superconductor must be deposited on a single crystal substrate of semiconductor, it is impossible or very difficult to prepare a thin film of oxide superconductor having good crystallinity. In fact, when an oxide superconducting material is deposited on a single crystal substrate of semiconductor such as a silicon single crystal, separated island portions of the oxide superconducting material which are separated from each other are formed initially on the substrate until a thin film of oxide superconducting material becomes to a thickness of about 200 Å. Therefore, even if deposition of the oxide superconducting material is continued further on such separated islands of the oxide superconducting material, the resulting thin film can not be a uniform and smooth thin film having good crystallinity.

Although a uniform and smooth thin film of oxide superconductor may be obtained by lowering a substrate temperature during deposition, the thin film prepared at low temperatures is poor in crystallinity in such extent that the thin film can not be used in actual applications.

Therefore, an object of the present invention is to solve the problems and to provide a process for preparing a single crystal thin film of oxide superconductor of high quality on a single crystal substrate of semiconductor such as silicon.

SUMMARY OF THE INVENTION

The present invention provides a process for preparing a thin film of oxide superconductor on a single crystal substrate of semiconductor by physical vapour deposition, characterized by the steps comprising depositing firstly an under-layer of an oxide having a thickness of 50 to 200 Å on the single crystal substrate of semiconductor at a substrate temperature of lower than 500° C., and depositing secondly an upper-layer of superconducting oxide material on the resulting under-layer at a substrate temperature of higher than 600° C.

The under-layer may be made of any oxide but is preferably made of the same superconducting oxide material as the upper layer or of an oxide having a similar crystal structure or lattice constants to that of the upper layer such as MgO, $SrTiO_3$, $LaAlO_3$, $LaGaO_3$ and yttrium stabilized zirconia (YSZ).

The upper-layer of superconducting oxide material can be made of any known superconducting oxide including Y—Ba—Cu—O system, Bi—Sr—Ca—Cu—O system and Tl—Ba—Ca—Cu—O system. In particular, the present invention is advantageously applicable for Y—Ba—Cu—O system and Bi—Sr—Ca—Cu—O system.

The single crystal substrate of semiconductor can be a single crystal of silicon or compound semiconductor such as GaAs, InP.

According to the process of the present invention, the under-layer is deposited at a substrate temperature of lower than 500° C. Lower limit of this substrate temperature depends on kinds of under-layer used but is preferably between 300° and 500° C., more preferably between 400° and 500° C. If the substrate temperature exceeds 500° C., vapour or particles of the oxide superconducting material arrived at and deposited on a surface of the substrate coagulate in a form of islands which are separated from each other in the first stage of deposition during which deposited particles of the oxide superconducting material form a thin film of oxide superconducting material having a thickness of about 200 Å. When the substrate temperature is lower than 500° C. according to the present invention, the vapour or particles of the oxide superconducting material arrived at the surface of the substrate are distributed uniformly over the surface of substrate and form a uniform under-layer.

Although this under-layer prepared at this stage is not composed of a single crystal, crystallinity of the under-layer is not important a this stage because such under-layer can be changed to a single crystal in next stage. In other words, a purpose of the under-layer is to form a uniform layer which is not separated like islands. In order to achieve this purpose, it is preferable to prepare an under-layer of amorphous which can be easily changed to single crystal at next stage.

The thickness of the under-layer is important and is limited to a range between 50 to 200 Å. If the thickness of the under-layer is not thicker than 50 Å, the upper-layer deposited on such under-layer in next stage can not be a uniform layer but will be composed of separate islands. If the thickness of the under-layer increase over 200 Å, such under-layer can not be changed to perfect single crystal in next stage. A preferable thickness of the under-layer is about 100 Å.

According to the process of the present invention, the upper-layer of oxide superconducting material is secondly deposited on the resulting under-layer at a substrate temperature of higher than 600° C. In this stage, the single crystal substrate of semiconductor is heated above 600° C., resulting in that the under-layer having poor crystallinity or amorphous which has been prepared in previous stage is re-crystallized to single crystal. The upper-layer of the oxide superconducting material thus prepared on the under-layer becomes a thin film of single crystal.

The substrate temperature for depositing the upper-layer of oxide superconducting material should be selected in such a range that the under-layer is re-crystallized to single crystal and also no damage is given to the single crystal substrate of semiconductor. The substrate temperature depends on kinds of oxide superconductor to be deposited but must be above 600° C. More precisely, when an upper-layer of Y—Ba—Cu—O system oxide is deposited, a preferable substrate temperature is about 640° C., and when an upper-layer of Bi—Sr—Ca—Cu—O system oxide is deposited, a preferable substrate temperature is about 700° C.

The process according to the present invention is carried out preferably by physical vapour deposition technique. RF sputtering method is preferable but vacuum deposition method also can be used. The under-layer and the upper-layer are preferably prepared successively in the presence of oxygen gas by RF sputtering in a same vacuum chamber. Apparatus and deposition conditions of RF sputtering themselves are known.

The process according to the present invention has such a merit that a thin film of oxide superconducting material having improved crystallinity can be prepared on a single crystal substrate of semiconductor by a simple modification of existing technology only by controlling the substrate temperature.

Now, the present invention will be described with reference to Examples, but the scope of the present invention should not be limited thereto.

Description of the Preferred Embodiments

In following Example, a thin film of oxide superconductor was prepared on a single crystal substrate of semiconductor by RF magnetron sputtering according to the process of the present invention.

EXAMPLE 1

A thin film of Y—Ba—Cu—O system superconducting oxide was prepared on a (100) plane of a single crystal substrate of silicon.

A target used in this Example was a sintered oxide of Y, Ba and Cu (atomic ratio:Y:Ba:Cu=1:2:2.6). By using this target, an under-layer of Y—Ba—Cu—O system oxide was firstly deposited on the single crystal substrate of silicon and then an upper-layer of Y—Ba—Cu—O system oxide was deposited on the resulting under-layer in a same vacuum chamber successively. Deposition conditions for the under-layer and the upper-layer are summarized in Table 1.

TABLE 1

| | Under-layer | Upper-layer |
|---|---|---|
| Substrate temperature (°C.): | 420 | 640 |
| Gas pressure (Torr): | 0.1 | 0.1 |
| Sputtering gas (Ar + $O_2$) $O_2$/(Ar + $O_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 640° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 2.

TABLE 2

| | Tc (K) | Jc (A/cm$^2$) | Surface condition |
|---|---|---|---|
| Invention | 82 | $1 \times 10^5$ | uniform and smooth |
| Comparative | 40 | — | uneven |

EXAMPLE 2

The same procedure as Example 1 was repeated but the single crystal substrate of silicon was replaced by a single crystal substrate of GaAs to prepare a thin film of Y—Ba—Cu—O system superconducting oxide on a (100) plane of the GaAs substrate. Deposition conditions for the under-layer and the upper-layer are summarized in Table 3.

TABLE 3

| | Under-layer | Upper-layer |
|---|---|---|
| Substrate temperature (°C.): | 380 | 630 |
| Gas pressure (Torr): | 0.1 | 0.1 |
| Sputtering gas (Ar + $O_2$) $O_2$/(Ar + $O_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 630° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 4.

TABLE 4

| | Tc (K) | Jc (A/cm$^2$) | Surface condition |
|---|---|---|---|
| Invention | 82 | $3 \times 10^5$ | uniform and smooth |
| Comparative | 45 | — | uneven |

EXAMPLE 3

The same procedure as Example 1 was repeated but the single crystal substrate of silicon was replaced by a single crystal substrate of InP to prepare a thin film of Y—Ba—Cu—O system superconducting oxide on a (100) plane of the InP substrate. Deposition conditions for the under-layer and the upper-layer are summarized in Table 5.

TABLE 5

| | Under-layer | Upper-layer |
|---|---|---|
| Substrate temperature (°C.): | 390 | 710 |
| Gas pressure (Torr): | 0.1 | 0.1 |
| Sputtering gas (Ar + $O_2$) $O_2$/(Ar + $O_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 710° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) were determined by usual methods. The results are summarized in table 6.

TABLE 6

|  | Tc (K) | Jc (A/cm$^2$) | Surface condition |
|---|---|---|---|
| Invention | 87 | 5 × 10$^5$ | uniform and smooth |
| Comparative | 50 | — | uneven |

EXAMPLE 4

A thin film of Bi—Sr—Ca—Cu—O system superconducting oxide was prepared on a (100) plane of a single crystal substrate of silicon.

A target used in this Example was a sintered oxide of Bi, Sr, Ca and Cu (atomic ratio:Bi:Sr:Ca:Cu=2:2:2:2.5). By using this target, an under-layer of Bi—Sr—Ca—Cu—O system oxide was firstly deposited on the single crystal substrate of silicon and then an upper-layer of Bi—Sr—Ca—Cu—O system oxide was deposited on the resulting under-layer in a same vacuum chamber successively. Deposition conditions for the under-layer and the upper-layer are summarized in Table 7.

TABLE 7

|  | Under-layer | Upper-layer |
|---|---|---|
| Substrate temperature (°C.): | 360 | 680 |
| Gas pressure (Torr): | 0.1 | 0.1 |
| Sputtering gas (Ar + O$_2$) O$_2$/(Ar + O$_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 680° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 8.

TABLE 8

|  | Tc (K) | Jc (A/cm$^2$) | Surface condition |
|---|---|---|---|
| Invention | 85 | 2 × 10$^5$ | uniform and smooth |
| Comparative | 60 | — | uneven |

EXAMPLE 5

The same procedure as Example 4 was repeated but the single crystal substrate of silicon was replaced by a single crystal substrate of GaAs to prepare a thin film of Bi—Sr—Ca—Cu—O system superconducting oxide on a (100) plane of the GaAs substrate. Deposition conditions for the under-layer and the upper-layer are summarized in Table 9.

TABLE 9

|  | Under-layer | Upper-layer |
|---|---|---|
| Substrate temperature (°C.): | 380 | 690 |
| Gas pressure (Torr): | 0.1 | 0.1 |
| Sputtering gas (Ar + O$_2$) O$_2$/(Ar + O$_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 690° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 10.

TABLE 10

|  | Tc (K) | Jc (A/cm$^2$) | Surface condition |
|---|---|---|---|
| Invention | 90 | 3 × 10$^5$ | uniform and smooth |
| Comparative | 67 | — | uneven |

EXAMPLE 6

The same procedure as Example 4 was repeated but the single crystal substrate of silicon was replaced by a single crystal substrate of InP to prepare a thin film of Bi—Sr—Ca—Cu—O system superconducting oxide on a (100) plane of the InP substrate. Deposition conditions for the under-layer and the upper-layer are summarized in Table 11.

TABLE 11

|  | Under-layer | Upper-layer |
|---|---|---|
| Substrate temperature (°C.): | 410 | 670 |
| Gas pressure (Torr): | 0.1 | 0.1 |
| Sputtering gas (Ar + O$_2$) O$_2$/(Ar + O$_2$) (vol %): | 20 | 20 |
| RF power density (W/cm$^2$): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 670° C. for both of the under-layer and the upper-layer. In this comparative sample, the total thickness of under-layer+the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 12.

TABLE 12

|  | Tc (K) | Jc (A/cm²) | Surface condition |
| --- | --- | --- | --- |
| Invention | 93 | $4 \times 10^5$ | uniform and smooth |
| Comparative | 70 | — | uneven |

EXAMPLE 7

The same procedure as Example 1 was repeated but the under-layer of Y—Ba—Cu—O system superconducting oxide was replaced by MgO oxide.

The under-layer of MgO oxide was firstly deposited by using a target of MgO on a (100) plane of single crystal substrate of silicon and then an upper-layer of Y—Ba—Cu—O system oxide was deposited secondly on the resulting under-layer of MgO by using the same target as Example 1 in a same vacuum chamber successively. Deposition conditions for the under-layer and the upper-layer are summarized in Table 13.

TABLE 13

|  | Under-layer (MgO) | Upper-layer (Y—Ba—Cu—O) |
| --- | --- | --- |
| Substrate temperature (°C.): | 300 | 640 |
| Gas pressure (Torr): | 0.1 | 0.1 |
| Sputtering gas (Ar + $O_2$) $O_2$/(Ar + $O_2$) (vol %): | 20 | 20 |
| RF power density (W/cm²): | 2 | 2 |
| Deposition rate (Å/sec): | 0.3 | 0.3 |
| Thickness of a layer (Å): | 100 | 4,000 |

For comparison, a comparative sample was prepared by the same method as above but the substrate temperature was maintained at a constant value of 640° C. for both of the under-layer and the upper-layer. In this comparative sample, the total thickness of under-layer + the upper-layer was adjusted to a same value as above (namely, 4,100 Å).

Surface conditions of the resulting superconducting thin films were observed by SEM (scanning electron microscopy) and the critical temperature (Tc) and the critical current density (Jc) at 77K were determined by usual methods. The results are summarized in table 14.

TABLE 14

|  | Tc (K) | Jc (A/cm²) | Surface condition |
| --- | --- | --- | --- |
| Invention | 82 | $3 \times 10^5$ | uniform and smooth |
| Comparative | 40 | — | uneven |

We claim:

1. A process for preparing a film of oxide superconductor on a single crystal substrate of semiconductor, which comprises depositing firstly by RF sputtering an under-layer of a superconducting oxide material having a thickness of 50 to 200 Å on said single crystal substrate of semiconductor at a substrate temperature between 300° and 500° C., and depositing secondly by RF sputtering an upper-layer of a superconducting oxide material on said under-layer at a substrate temperature of higher than 600° C., said upper-layer of superconducting oxide material having a thickness which is more than 500 Å thicker than said under-layer wherein both said under-layer and said upper-layer are deposited in a same vacuum chamber.

2. The process set forth in claim 1, wherein said under-layer has a thickness of about 100 Å.

3. The process set forth in claim 1 wherein the superconducting oxide material of said under-layer is different from the superconducting oxide material of said upper-layer.

4. The process set forth in claim 5 wherein the superconducting oxide material of said under-layer has a similar crystal structure or lattice constant to that of said upper-layer.

5. The process set forth in claim 1 wherein said single crystal substrate of semiconductor is made of silicon or compound semiconductor.

6. The process set forth in claim 1 wherein said upper-layer of the superconducting oxide material is selected from the group consisting of Y—Ba—Cu—O system, Bi—Sr—Ca—Cu—O system and Tl—Ba—Ca—Cu—O system.

7. The process set forth in claim 6 wherein said upper-layer of the superconducting oxide material is Y—Ba—Cu—O system and is deposited at a substrate temperature about 640° C.

8. The process set forth in claim 6 wherein said upper-layer of the superconducting oxide material is Bi—Sr—Ca—Cu—O system and is deposited at a substrate temperature about 700° C.

* * * * *